(12) United States Patent
Huang et al.

(10) Patent No.: US 10,153,233 B1
(45) Date of Patent: Dec. 11, 2018

(54) INTERCONNECT STRUCTURE AND FABRICATING METHOD THEREOF

(71) Applicant: MACRONIX International Co., Ltd., Hsinchu (TW)

(72) Inventors: Chi-Hao Huang, Hsinchu (TW); Chin-Cheng Yang, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 15/655,596

(22) Filed: Jul. 20, 2017

(51) Int. Cl.
*H01L 23/522* (2006.01)
*H01L 23/528* (2006.01)
*H01L 21/768* (2006.01)

(52) U.S. Cl.
CPC .... *H01L 23/5283* (2013.01); *H01L 21/76805* (2013.01); *H01L 21/76831* (2013.01); *H01L 23/5221* (2013.01); *H01L 23/5226* (2013.01)

(58) Field of Classification Search
CPC ............. H01L 23/5226; H01L 21/76805
See application file for complete search history.

(56) References Cited

U.S. PATENT DOCUMENTS 9,583,429 B2 * 2/2017 Sung .............. H01L 23/5226
2012/0104471 A1 5/2012 Chang et al.

OTHER PUBLICATIONS

"Office Action of Taiwan Counterpart Application," dated Mar. 13, 2018, p. 1-p. 5.

* cited by examiner

*Primary Examiner* — Mark Prenty
(74) *Attorney, Agent, or Firm* — J.C. Patents

(57) ABSTRACT

An interconnect structure including a first dielectric layer, a first conductive layer, a second conductive layer, a capping layer, and a via is provided. The first dielectric layer has a first trench and a second trench. The first conductive layer is located in the first trench. The second conductive layer is located in the second trench, and a top surface of the second conductive layer is lower than a top surface of the first dielectric layer. The capping layer having a via opening exposing a portion of the first conductive layer covers the first dielectric layer, the first conductive layer, and the second conductive layer. The via located on the first conductive layer and the first dielectric layer located between the first conductive layer and the second conductive layer is filled into the via opening and electrically connected to the first conductive layer.

6 Claims, 5 Drawing Sheets

INTERCONNECT STRUCTURE AND FABRICATING METHOD THEREOF

BACKGROUND OF THE INVENTION

1. Field of the Invention

The invention relates to a semiconductor structure and a fabricating method thereof, and particularly relates to an interconnect structure and a fabricating method thereof.

2. Description of Related Art

As the size of semiconductor devices continues to be reduced, an overlay window between an upper-layer conductive element and a lower-layer conductive element is also reduced. Therefore, there may easily be an overlay shift, which reduces the reliability of the semiconductor devices. For example, a dielectric layer of an interconnect structure has a plurality of conductive layers, and a via is located on and electrically connected to the corresponding conductive layer. When the via is severely misaligned, the via may cover on the dielectric layer between two adjacent conductive layers in addition to being located on the corresponding conductive layer. Accordingly, when a high operating voltage is applied, metal ions in the via or in the conductive layer may easily pass through the dielectric layer, migrate to an adjacent conductive layer (not in direct contact with the via), and result in a short circuit. Therefore, how to increase the reliability of the interconnect structure remains an issue for researchers to work on.

SUMMARY OF THE INVENTION

The invention provides an interconnect structure having a good reliability and a fabricating method thereof.

An embodiment of the invention provides an interconnect structure, including a first dielectric layer, a first conductive layer, a second conductive layer, a capping layer, and a via. The first dielectric layer has a first trench and a second trench. The first conductive layer is located in the first trench. The second conductive layer is located in the second trench, and a top surface of the second conductive layer is lower than a top surface of the first dielectric layer. The capping layer covers the first dielectric layer, the first conductive layer, and the second conductive layer, and has a via opening exposing a portion of the first conductive layer. The via is located on the first conductive layer and the first dielectric layer between the first conducive layer and the second conductive layer, and the via is filled into the via opening, and electrically connected to the first conductive layer.

According to an embodiment of the invention, a top surface of the first conductive layer is lower than a top surface of the first dielectric layer.

According to an embodiment of the invention, a minimum distance between the via and the second conductive layer is greater than or equal to a shift threshold $D_s$, and $D_s=8$ nm.

According to an embodiment of the invention, the capping layer covers sidewalls of the second trench and the top surface of the second conductive layer, a first distance x in an X direction is provided between the via and the second conductive layer, and $x>0$ nm.

According to an embodiment of the invention, the capping layer fills the second trench, the via covers the second conductive layer, a second distance y in a Y direction is provided between the via and the second conductive layer, and $y \geq D_s$.

According to an embodiment of the invention, the interconnect structure further includes a second dielectric layer covering the capping layer and surrounding the via.

An embodiment of the invention provides a fabricating method of an interconnect structure including the following. A first trench and a second trench are formed in a first dielectric layer. A conductive material layer is filled into the first trench and the second trench. A portion of the conductive material layer is removed to respectively form a first conductive layer and a second conductive layer in the first trench and the second trench. In addition, top surfaces of the first conductive layer and the second conductive layer are lower than a top surface of the first dielectric layer. A capping layer is formed on the first dielectric layer, the first conductive layer, and the second conductive layer. A second dielectric layer is formed on the capping layer. A via is formed in the capping layer and the second dielectric layer. In addition, the via is formed on the first conductive layer and on the first dielectric layer between the first conductive layer and the second conductive layer, and the via is electrically connected to the first conductive layer.

According to an embodiment of the invention, a minimum distance between the via and the second conductive layer is greater than or equal to a shift threshold $D_s$, and $D_s=8$ nm.

According to an embodiment of the invention, the capping layer covers sidewalls of the second trench and the top surface of the second conductive layer, a first distance x in an X direction is provided between the via and the second conductive layer, and $x>0$ nm.

According to an embodiment of the invention, the capping layer fills the second trench, the via covers the second conductive layer, a second distance y in a Y direction is provided between the via and the second conductive layer, and $y \geq D_s$.

In view of the foregoing, in the interconnect structure and the fabricating method of the interconnect structure according to the embodiments of the invention, since the top surface of the second conductive layer is lower than the top surface of the first dielectric layer, the minimum distance between the second conductive layer and the via is able to be increased. Accordingly, the distance between the second conductive layer and the via can be prevented from being smaller than the shift threshold, thereby preventing a short circuit. Therefore, while a miniaturized design of the interconnect structure is able to sustain, the overlay window between the via and the first conductive layer is able to be increased, so as to increase the reliability of the interconnect structure.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
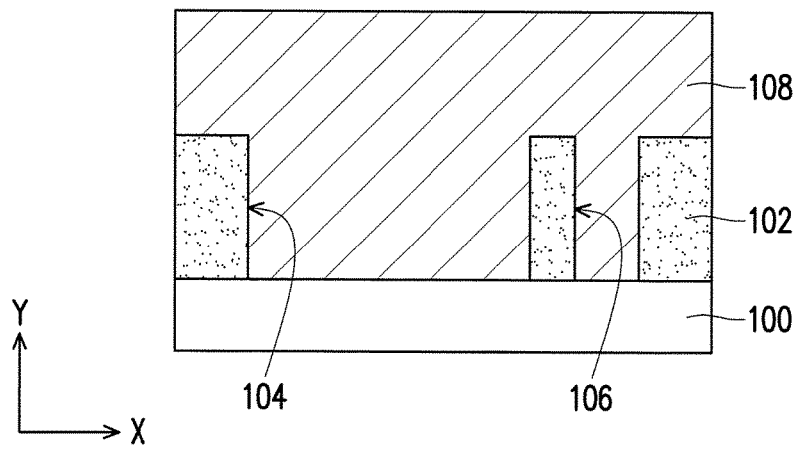
FIGS. 1A to 1F are schematic cross-sectional views illustrating a fabricating method of an interconnect structure according to an embodiment of the disclosure.

The invention is more comprehensively described with reference to the figures of the present embodiments. However, the invention can also be implemented in various different forms, and is not limited to the embodiments described herein. The thicknesses of the layers and regions in the figures are enlarged for clarity. The same or similar reference numerals represent the same or similar components and are not described repetitively in detail in the following paragraphs.

Figure 2:
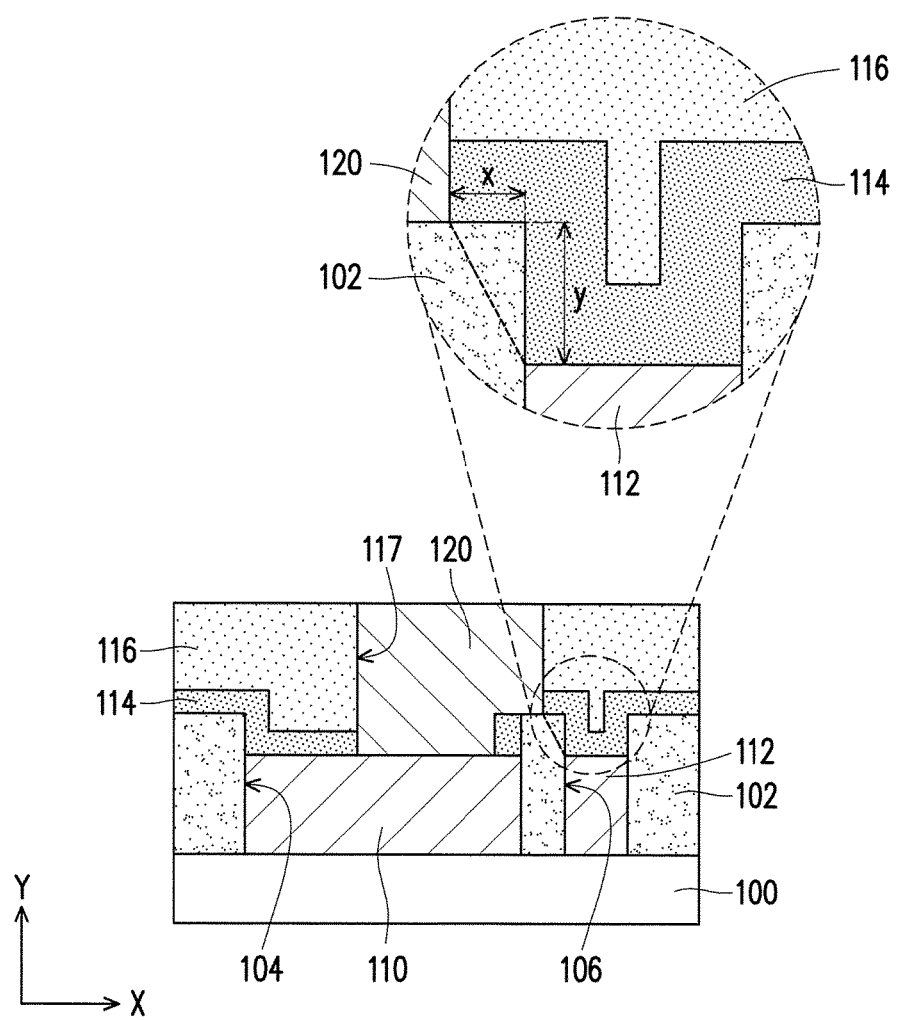
FIG. 2 is a schematic cross-sectional view illustrating an interconnect structure according to another embodiment of the disclosure.
Figure 3:
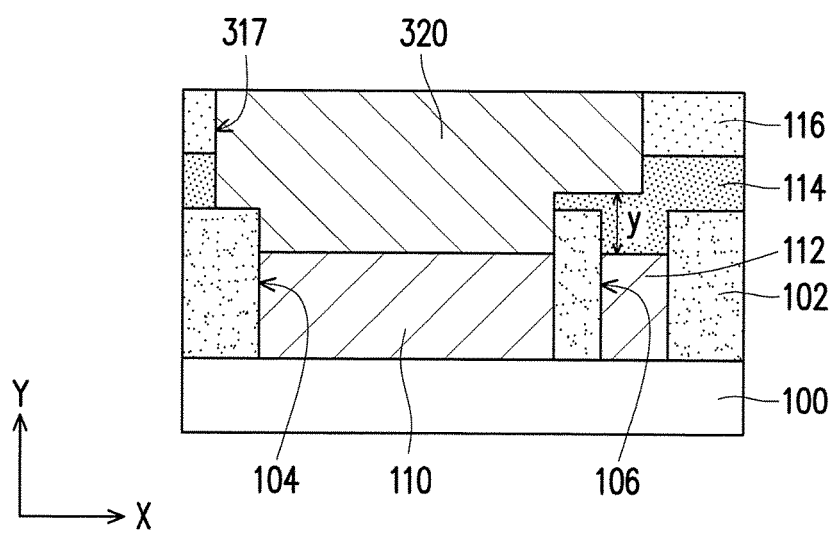
FIG. 3 is a schematic cross-sectional view illustrating an interconnect structure according to yet another embodiment of the disclosure.

FIGS. 1A to 1F are schematic cross-sectional views illustrating a fabricating method of an interconnect structure according to an embodiment of the disclosure. FIG. 2 is a schematic cross-sectional view illustrating an interconnect structure according to another embodiment of the disclosure. FIG. 3 is a schematic cross-sectional view illustrating an interconnect structure according to yet another embodiment of the disclosure.

Referring to FIG. 1A, a substrate 100 is provided. The substrate 100 includes a semiconductor substrate. The semiconductor substrate is a silicon-doped substrate, a silicon-free substrate, or a silicon-on-insulator (SOI) substrate, for example. The silicon-doped substrate may include a P-type dopant, an N-type dopant, or a combination thereof. In some embodiments, the substrate 100 further includes an interlayer dielectric layer and/or a contact. However, the invention is not limited thereto. In some other embodiments, the substrate 100 includes an interlayer dielectric layer and/or a contact, and further includes an intermetal dielectric (IMD) layer, and a conductive layer and/or a via of a multi-level metal interconnect.

Then, a first dielectric layer 102 is formed on the substrate 100. A material of the first dielectric layer 102 includes a dielectric material, for example. The dielectric material includes silicon oxide, tetraethoxysilane (TEOS) silicon oxide, silicon nitride, silicon oxynitride, undoped silicon glass (USG), borophosphosilicate glass (BPSG), phosphosilicate glass (PSG), a low-k material with a dielectric constant lower than 4, or a combination thereof, for example. The low-k material includes fluorosilicate glass (FSG), silsesquioxnane, an aromatic hydrocarbon compound, organosilicate glass, parylene, a fluoro-polymer, a poly(arylethers), a porous polymer, or a combination thereof, for example. The silsesquioxnane includes hydrogen silsesquioxane (HSQ), methyl silsesquioxane (MSQ), or a hybrido-organo siloxane polymer (HOSP), for example. The aromatic hydrocarbon compound includes silicon low-k (SiLK), for example. The organosilicate glass includes black diamond (BD), trimethyl-silane (3MS), or tetramethyl-silane (4MS), for example. The fluoro-polymer includes per-fluorocyclobutyl (PFCB), a cyclized transparent optical polymer (CYTOP), or polytetrafluorethylene (Teflon), for example. The poly(arylethers) includes poly(arylene ether) (PAE2) or fluorinated poly(arylene ether) (FLARE), for example. The porous polymer includes XLK, Nanofoam, Awrogel, or Coral, for example. A process of forming the first dielectric layer 102 includes performing an atomic layer deposition (ALD) process, a chemical vapor deposition (CVD) process, a spin-coating process (SOG) or a combination thereof, for example.

Then, a first trench 104 and a second trench 106 are formed in the first dielectric layer 102. In some embodiments, a process of forming the first trench 104 and the second trench 106 in the first dielectric layer 102 includes forming a patterned photoresist layer (not shown) on the first dielectric layer 102. Then, the first dielectric layer 102 exposed by the patterned photoresist layer is removed to form the first trench 104 and the second trench 106 in the first dielectric layer 102. The patterned photoresist layer is then removed. A process of removing the first dielectric layer 102 exposed by the patterned photoresist layer includes performing an etching process, such as a dry etching process, a wet etching process, or a combination thereof. A process of removing the patterned photoresist layer includes performing an ashing process, for example.

Then, a conductive material layer 108 is filled into the first trench 104 and the second trench 106. In addition, the conductive material layer 108 covers the first dielectric layer 102 and fills the first trench 104 and the second trench 106. The conductive material layer 108 includes a metal, a metal alloy, a metal nitride, a metal silicide, or a combination thereof. In some exemplary embodiments, the metal and the metal alloy may include, copper (Cu), aluminum (Al), titanium (Ti), tantalum (Ta), tungsten (W), platinum (Pt), chromium (Cr), molybdenum (Mo), or an alloy thereof, for example. The metal nitride includes titanium nitride, tungsten nitride, tantalum nitride, tantalum silicon nitride (TaSiN), titanium silicon nitride (TiSiN), tungsten silicon nitride (WSiN), or a combination thereof, for example. The metal silicide includes tungsten silicide, titanium silicide, cobalt silicide, zirconium silicide, platinum silicide, molybdenum silicide, copper silicide, nickel silicide, or a combination thereof, for example. A process of forming the conductive material layer 108 includes performing an atomic layer deposition (ALD) process, a chemical vapor deposition (CVD) process, a physical vapor deposition (PVD) process, or a combination thereof, for example.

Figure 1B:
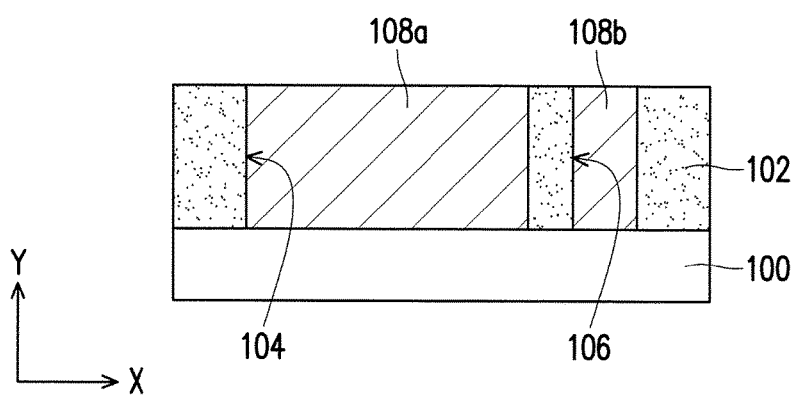

Referring to FIGS. 1A and 1B, the conductive material layer 108 located on the first dielectric layer 102 is removed to respectively form a conductive material layer 108a and a conductive material layer 108b in the first trench 104 and the second trench 106. A process of removing the conductive material layer 108 on the first dielectric layer 102 includes performing a planarization process on the conductive material layer 108, for example. The planarization process includes performing a chemical mechanical polishing process (CMP), for example. In some embodiments, top surfaces of the conductive material layers 108a and 108b are coplanar with a top surface of the first dielectric layer 102.

Figure 1C:
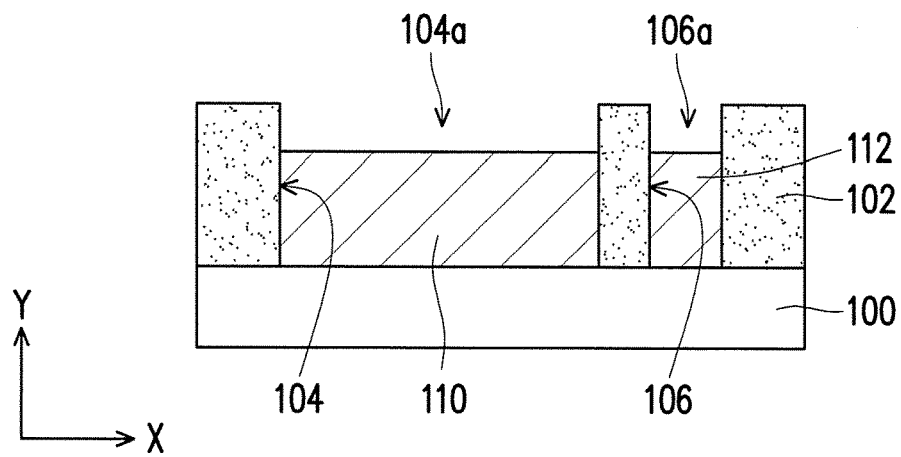

Referring to FIGS. 1B and 1C, a portion of the conductive material layer 108a and a portion of the conductive material layer 108b are removed to respectively form a first conductive layer 110 and a second conductive layer 112 in the first trench 104 and the second trench 106. In addition, top surfaces of the first conductive layer 110 and the second conductive layer 112 are lower than the top surface of the first dielectric layer 102. In other words, the top surfaces of the first conductive layer 110 and the second conductive layer 112 and sidewalls of the first dielectric layer 102 respectively define a recess 104a and a recess 106a. Hence, a minimum distance between the second conductive layer 112 and a via 120 subsequently formed on and electrically connected to the first conductive layer 110 is able to be increased. Even if there is an overlay shift when the via 120 is formed, the distance between the via 120 and the second conductive layer 112 is still greater than a shift threshold $D_s$. Thus, when a high operating voltage is applied, conductive ions (e.g., metal ions) in the via 120 may be prevented from migrating to the second conductive layer 112 and resulting in a short circuit. Hence, the reliability of the interconnect structure is increased. The shift threshold $D_s$ refers to a minimum distance sufficient to prevent the conductive ions in the via 120 from migrating to the second conductive layer 112 through the capping layer 114 and/or the first dielectric layer 102. In some embodiments, the shift threshold $D_s$ can be obtained through formula (1) set forth below:

formula (1)

$$D_s = \frac{W110 - W120}{2} + W102 - S120$$

In the formula (1), $D_s$ represents a shift threshold; W110 represents a width of the first conductive layer 110; W120 represents a width of the via 120; W102 represents a width of the first dielectric layer 102 located between two adjacent conductive layer (e.g., the first dielectric layer 102 located between the first conductive layer 110 and the second conductive layer 112); S120 represents a maximum overlay shift specification of the via 120.

As an example, the width of the first conductive layer 110 is 161 nm; the width of the via 120 is 151 nm; the width of the first dielectric layer 102 located between the first conductive layer 110 and the second conductive layer 112 is 15 nm; the maximum overlay shift specification of the via 120 is 12 nm, under this circumstance, the shift threshold is 8 nm ([161−151]/2+15−12).

In some embodiments, a portion of the conductive material layer 108a and a portion of the conductive material layer 108b may be removed by performing an etching back process. However, the invention is not limited thereto. In some embodiments, the conductive material layer 108b in the second trench 106 may be optionally removed to keep the top surface of the second conductive layer 112 lower than the top surface of the first dielectric layer 102, and the top surface of the first conductive layer 110 is coplanar with the top surface of the first dielectric layer 102.

Figure 1D:
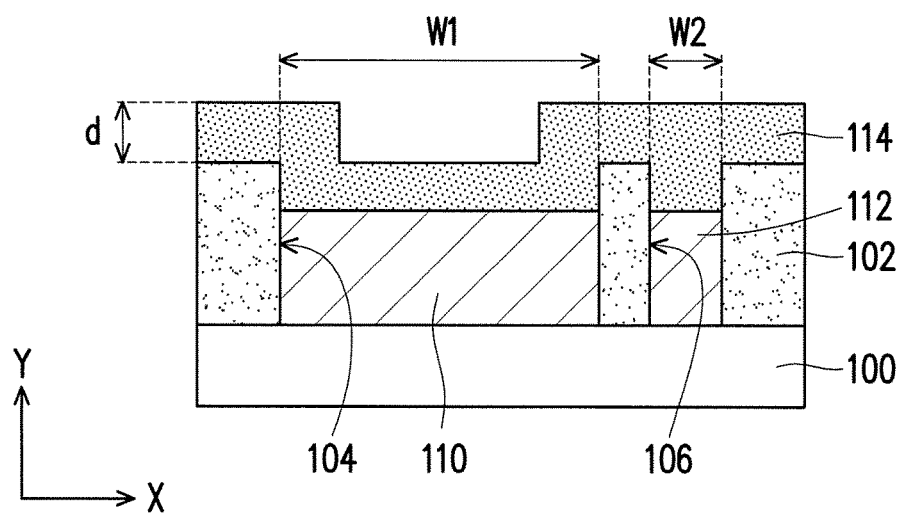

Referring to FIGS. 1C and 1D, the capping layer 114 is formed on the first dielectric layer 102, the first conductive layer 110, and the second conductive layer 112. A material of the capping layer 114 includes silicon nitride (SiN), silicon carbide (SiC), silicon oxycarbide (SiCO), silicon carbon nitride (SiNC), or a combination thereof, for example. However, the invention is not limited thereto. In some embodiments, the capping layer 114 is conformally formed on the surfaces of the recess 104a, the recess 106a, and the first dielectric layer 102. In other words, the capping layer 114 covers sidewalls of the first trench 104 and the second trench 106 and the top surfaces of the first conductive layer 110, the second conductive layer 112, and the first dielectric layer 102. In some other embodiments, a width W1 of the first trench 104 is greater than a width W2 of the second trench 106. Therefore, when a thickness d of the capping layer 114 is greater than or equal to a half of the width W2 of the second trench 106, i.e., when d≥W2/2, the capping layer 114 is conformally formed on the surfaces of the recess 104a and the first dielectric layer 102 and fills the recess 106a. In other words, the capping layer 114 not only covers the sidewalls of the first trench 104 and the second trench 106 and the top surfaces of the first conductive layer 110, the second conductive layer 112, and the first dielectric layer 102, but also fills the second trench 106. In some embodiments, the width W1 of the first trench 104 is 161 nm, the width W2 of the second trench 106 is 27 nm, and a width of the first dielectric layer 102 between the first trench 104 and the second trench 106 is 15 nm.

Figure 1E:
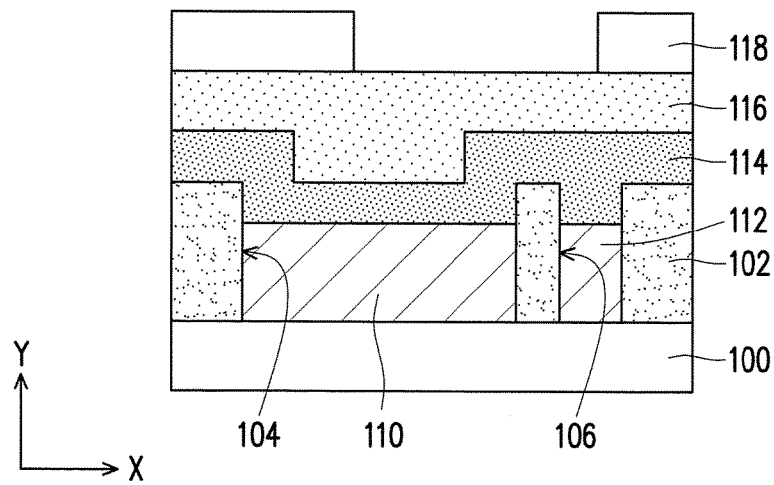

Referring to FIG. 1E, a second dielectric layer 116 is formed on the capping layer 114. A material of the second dielectric layer 116 includes a dielectric material, for example. The dielectric material includes silicon oxide, tetraethoxysilane (TEOS) silicon oxide, silicon nitride, silicon oxynitride, undoped silicon glass (USG), borophosphosilicate glass (BPSG), phosphosilicate glass (PSG), a low-k material with a dielectric constant lower than 4, or a combination thereof, for example. The low-k material includes fluorosilicate glass (FSG), silsesquioxnane, an aromatic hydrocarbon compound, organosilicate glass, parylene, a fluoro-polymer, a poly(arylethers), a porous polymer, or a combination thereof, for example. The silsesquioxnane includes hydrogen silsesquioxane (HSQ), methyl silsesquioxane (MSQ), or a hybrido-organo siloxane polymer (HOSP), for example. The aromatic hydrocarbon compound includes silicon low-k (SiLK), for example. The organosilicate glass includes black diamond (BD), trimethyl-silane (3MS), or tetramethyl-silane (4MS), for example. The fluoro-polymer includes perfluorocyclobutyl (PFCB), a cyclized transparent optical polymer (CYTOP), or polytetrafluorethylene (Teflon), for example. The poly(arylethers) includes poly(arylene ether) (PAE2) or fluorinated poly (arylene ether) (FLARE), for example. The porous polymer includes XLK, Nanofoam, Awrogel, or Coral, for example. A process of forming the second dielectric layer 116 includes performing an ALD process, a CVD process, a SOG process, or a combination thereof, for example.

Figure 1F:
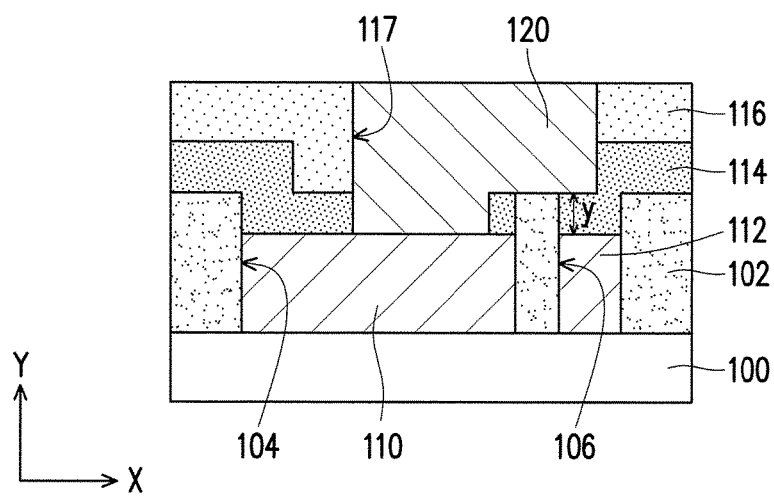

Referring to FIGS. 1E and 1F, the via 120 is formed in the capping layer 114 and the second dielectric layer 116. The via 120 is formed on the first conductive layer 110 and the first dielectric layer 102 located between the first conductive layer 110 and the second conductive layer 112. In addition, the via 120 is electrically connected to the first conductive layer 110. A material of the via 120 includes a metal, a metal alloy, a metal nitride, a metal silicide, or a combination thereof. In some exemplary embodiments, the metal and the metal alloy may include, copper (Cu), aluminum (Al), titanium (Ti), tantalum (Ta), tungsten (W), platinum (Pt), chromium (Cr), molybdenum (Mo), or an alloy thereof, for example. The metal nitride includes titanium nitride, tungsten nitride, tantalum nitride, tantalum silicon nitride (TaSiN), titanium silicon nitride (TiSiN), tungsten silicon nitride (WSiN), or a combination thereof, for example. The metal silicide includes tungsten silicide, titanium silicide, cobalt silicide, zirconium silicide, platinum silicide, molybdenum silicide, copper silicide, nickel silicide, or a combination thereof, for example. In some embodiments, a process of forming the via 120 includes forming a patterned photoresist layer 118 on the second dielectric layer 116. Then, using the capping layer 114 as a stop layer, the second dielectric layer 116 exposed by the patterned photoresist layer 118 is removed. Then, the capping layer 114 exposed by the second dielectric layer 116 is removed to form a via opening 117 exposing the first conductive layer 110. Then, the patterned photoresist layer 118 is removed. Finally, a conductive material (whose material is similar to the material of the via 120, for example) is filled into the via opening 117, and a planarization process (such as a CMP process) is performed on the conductive material to form the via 120 in the capping layer 114 and the second dielectric layer 116.

Then, the patterned photoresist layer 118 is removed. A process of removing the second dielectric layer 116 includes performing an etching process, such as a dry etching process, a wet etching process, or a combination thereof, for example. In some embodiments, the process of removing the second dielectric layer 116 includes performing a selective etching process. However, the invention is not limited thereto. A process of removing the capping layer 114 includes performing an etching process, such as a dry etching process, a wet etching process, or a combination thereof. In some embodiments, the process of removing the capping layer 114 includes performing a time mode etching process. However, the invention is not limited thereto. A process of filling the conductive material into the via opening 117 includes performing an ALD process, a CVD process, a PVD process, or a combination thereof, for example. A process of removing the patterned photoresist layer 118 includes performing an ashing process, for example.

Referring to FIGS. 1F and 2, the minimum distance between the via 120 and the second conductive layer 112 is greater than the shift threshold $D_s$. Thus, when a high operating voltage is applied, conductive ions (e.g., metal ions) in the via 120 may be prevented from migrating to the second conductive layer 120 and resulting in a short circuit. Hence, the reliability of the interconnect structure is increased. In some embodiments, a first distance x in an X direction and a second distance Y in a Y direction are respectively provided between the via 120 and the second conductive layer 112, as shown in FIG. 2. When $y \geq D_s$, even if the via 120 covers the second conductive layer 112 (i.e., x=0), the capping layer 114 between the via 120 and the second conductive layer 112 still has a sufficient thickness to block the metal ions (e.g., copper ions) in the via 120 from migrating to the second conductive layer 112 and prevent a short circuit. In some other embodiments, as shown in FIG. 2, when $x \geq D_s$ and y>0 (i.e., when the top surface of the second conductive layer 112 is lower than the top surface of the first dielectric layer 102), the via 120 does not cover the second conductive layer 112, and the minimum distance (a distance represented by a dash line, i.e., $\sqrt{x^2+y^2}$) between the via 120 and the second conductive layer 112 is greater than the shift threshold $D_s$. Besides, the smaller the overlay shift between the via 120 and the first conductive layer 110 (i.e., the greater the x), the greater the minimum distance between the via 120 and the second conductive layer 112. Therefore, a short circuit is less likely to occur. In other words, with a design of keeping the top surface of the second conductive layer 112 lower than the top surface of the first dielectric layer 102 (i.e., y>0), not only a miniaturized design of the interconnect structure is able to sustain, an overlay window between the via 120 and the first conductive layer 110 is also increased.

As an example, the shift threshold $D_s$ between the via 120 and the second conductive layer 112 is 8 nm (i.e., the maximum overlay shift specification of the via 120 is 12 nm). When the top surface of the second conductive layer 112 and the top surface of the first dielectric layer 102 are coplanar (i.e., y=0), and the first distance x is 6 nm (i.e., the shift amount of the via 120 is greater than the maximum overlay shift specification), the minimum distance between the via 120 and the second conductive layer 112 is 6 nm. The minimum distance is smaller than the shift threshold $D_s$, so a short circuit is likely to occur. However, when the top surface of the second conductive layer 112 is lower than the top surface of the first dielectric layer 102, and the second distance y is 8 nm, the minimum distance between the via 120 and the second conductive layer 112 is increased from 6 nm to 10 nm ($\sqrt{6^2+8^2}=10$). The minimum distance is greater than the shift threshold $D_s$, so even if the shift amount of the via 120 is greater than the maximum overlay shift specification, a short circuit may still be prevented from occurring. In other words, in the case that the width W1 of the first conductive layer 110 is not increased, even if the same machine is used to form the interconnect structure (i.e., the limit of the resolution of the machine is the same), the minimum distance between the via 120 and the second conductive layer 112 may be greater than or equal to the shift threshold $D_s$.

Besides, as shown in FIG. 2, in some embodiments, since the capping layer 114 does not completely fill the second trench 106, the second dielectric layer 116 subsequently formed on the capping layer 114 is filled into the second trench 106. Hence, in the process of forming the via opening 117, removing the second dielectric layer 116 exposed by the patterned photoresist layer by using the capping layer 114 as the stop layer may extend the via opening 117 downward to the capping layer 114 in the second trench 106 and consequently reduce the minimum distance between the via 120 and the second conductive layer 112. Therefore, when the capping layer 114 does not completely fill the second trench 106, the via 120 does not cover the top of the second conductive layer 112. Consequently, the minimum distance between the via 120 and the second conductive layer 112 is not reduced and a short circuit is thus prevented.

In addition, as shown in FIG. 3, in some embodiments, the width of the via 320 is greater than the width of the first conductive layer 110, and the via 320 fills in the recess 104a located on the first conductive layer 110 (see FIG. 1C). In other words, even if there is no overlay shift between the via 320 and the first conductive layer 110, the via 320 still covers the first dielectric layer 102 located between the first conductive layer 110 and the second conductive layer 112, and even covers a portion of the second conductive layer. Therefore, by the design that the top surface of the second conductive layer 112 is lower than the top surface of the first dielectric layer 102, the minimum distance between the second conductive layer 112 and the via 320 is able to be increased (as shown by the second distance y). Accordingly, the distance between the second conductive layer 112 and the via 320 can be prevented from being smaller than the shift threshold, thereby preventing a short circuit.

In the following, the interconnect structure of the embodiment is described with reference to FIGS. 1F and 2. Besides, even though the fabricating method of the interconnect structure of the embodiment is described using the above fabricating method as an example, the fabricating method of the interconnect structure of the invention is not limited thereto.

Referring to FIG. 1F, the interconnect structure includes the first dielectric layer 102, the first conductive layer 110, the second conductive layer 112, the capping layer 114, and the via 120. The first dielectric layer 102 has the first trench 104 and the second trench 106. The first conductive layer 110 is located in the first trench 104. The second conductive layer 112 is located in the second trench 106, and the top surface of the second conductive layer 112 is lower than the top surface of the first dielectric layer 102. The capping layer 114 covers the first dielectric layer 102, the first conductive layer 110, and the second conductive layer 112. In addition, the capping layer 114 has the via opening 117 exposing a portion of the first conductive layer 110. The via 120 is located on the first conductive layer 110 and on the first dielectric layer 102 between the first conductive layer 110 and the second conductive layer 112. In addition, the via 120 is filled into the via opening 117 and is electrically connected to the first conductive layer 110. In addition, the minimum distance between the via 120 and the second conductive layer 112 is greater than or equal to the shift threshold $D_s$. In some embodiments, when the capping layer 114 fills the second trench 106, and the via 120 covers the second conductive layer 112, the second distance y in the Y direction is provided between the via 120 and the second conductive layer 112, and y≥$D_s$. In some other embodiments, as shown in FIG. 2, when the capping layer 114 covers the sidewalls of the second trench 106 and the top surface of the second conductive layer 112, and does not completely fill the second trench 106, the first distance x in the X direction and the second distance y in the Y direction are respectively provided between the via 120 and the second conductive layer 112, and x>0 nm. Consequently, the distance between the via 120 and the second conductive layer 112 is the distance represented by the dash line (i.e., $\sqrt{x^2+y^2}$) In some embodiments, the shift threshold $D_s$ is 8 nm. In some embodiments, the top surface of the first conductive layer 110 may be optionally lower than the top surface of the first dielectric layer 102. In some embodiments, the interconnect structure further includes the second dielectric layer 116 covering the capping layer 114 and surrounding the via 120. Moreover, reference of the materials and processes of disposing and forming the respective components in the interconnect structure can be found in descriptions of the fabricating method shown in FIGS. 1A to 1F. Therefore, details in this regard will not be repeated in the following.

In view of the foregoing, in the interconnect structure and the fabricating method of the interconnect structure according to the embodiments of the invention, since the top surface of the second conductive layer is lower than the top surface of the first dielectric layer, the minimum distance between the second conductive layer and the via is able to be increased. Accordingly, the distance between the second conductive layer and the via can be prevented from being smaller than the shift threshold, thereby preventing a short circuit. Therefore, while a miniaturized design of the interconnect structure is able to sustain, the overlay window between the via and the first conductive layer is able to be increased, so as to increase the reliability of the interconnect structure.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An interconnect structure, comprising:
   a first dielectric layer, having a first trench and a second trench;
   a first conductive layer, located in the first trench;
   a second conductive layer, located in the second trench, and a top surface of the second conductive layer is lower than a top surface of the first dielectric layer;
   a capping layer, covering the first dielectric layer, the first conductive layer, and the second conductive layer, and having a via opening exposing a portion of the first conductive layer; and
   a via, located on the first conductive layer and the first dielectric layer between the first conductive layer and the second conductive layer, filled into the via opening, and electrically connected to the first conductive layer, wherein the via covers the second conductive layer.

2. The interconnect structure as claimed in claim 1, wherein a top surface of the first conductive layer is lower than a top surface of the first dielectric layer.

3. The interconnect structure as claimed in claim 1, wherein a minimum distance between the via and the second conductive layer is greater than or equal to a shift threshold $D_s$, and $D_s$=8 nm.

4. The interconnect structure as claimed in claim 3, wherein the capping layer fills the second trench.

5. The interconnect structure as claimed in claim 4, wherein a second distance y in a Y direction is provided between the via and the second conductive layer, and y≥$D_s$.

6. The interconnect structure as claimed in claim 1, further comprising:
   a second dielectric layer, covering the capping layer and surrounding the via.

* * * * *